(12) United States Patent
Häberle et al.

(10) Patent No.: US 6,385,266 B1
(45) Date of Patent: May 7, 2002

(54) SAMPLING PLL FOR HIGH RESOLUTION RADAR SYSTEMS

(75) Inventors: Babette Häberle, Blaustein; Walter Ludwig, Nersingen; Harald Schuster, Neu-Ulm, all of (DE)

(73) Assignee: EADS Deutschland GmbH, München (DE)

( * ) Notice: Subject to any disclaimer, the term of this patent is extended or adjusted under 35 U.S.C. 154(b) by 0 days.

(21) Appl. No.: 09/185,622

(22) Filed: Nov. 4, 1998

(30) Foreign Application Priority Data

Nov. 4, 1997 (DE) .......................... 197 48 608

(51) Int. Cl.$^7$ ................................ H03D 3/24
(52) U.S. Cl. .................. 375/376; 375/375; 327/119; 327/156; 342/87
(58) Field of Search ................ 375/373–376, 375/327; 327/113, 119, 144–148, 155–157, 160, 162, 163; 331/53, 74, 76, 177 R, 178, 179; 713/500, 501; 342/31, 83, 87, 100, 103, 70; 332/127; 455/113, 120

(56) References Cited

U.S. PATENT DOCUMENTS

| | | | | |
|---|---|---|---|---|
| 3,882,424 A | * | 5/1975 | Debois et al. | 332/127 |
| 4,503,433 A | * | 3/1985 | Tomasi | 342/87 |
| 4,543,577 A | * | 9/1985 | Tachibana et al. | 340/904 |
| 4,591,859 A | * | 5/1986 | Campbell | 342/201 |
| 5,353,311 A | * | 10/1994 | Hirata et al. | 375/202 |
| 6,018,275 A | * | 1/2000 | Perrett et al. | 332/127 |
| 6,069,581 A | * | 5/2000 | Bell et al. | 342/70 |

* cited by examiner

*Primary Examiner*—Chi Pham
*Assistant Examiner*—Phuong Phu
(74) *Attorney, Agent, or Firm*—Venable; Norman N. Kunitz

(57) ABSTRACT

A low-noise sampling PLL for high-resolution radar systems wherein the reference frequencies are taken from a line spectrum (SPK), which has been generated from the mixture of a low quartz oscillator frequency (F1) with a high quartz oscillator frequency (F2), with the quartz oscillator frequencies (F1, F2) being synchronized. The invention is employed in connection with sampling PLLs for high-resolution radar systems with a controllable frequency oscillator, whose output signal is partially coupled out into a feedback branch and compared with reference frequencies in a phase comparator.

15 Claims, 1 Drawing Sheet

SAMPLING PLL FOR HIGH RESOLUTION RADAR SYSTEMS

REFERENCE TO RELATED APPLICATIONS

This application claims the priority of German Application Ser. No. 197 48 608.8, filed Nov. 4, 1997, which is incorporated herein by reference.

FIELD OF THE INVENTION

The invention relates to a sampling Phase Locked Loop (PLL) for high-resolution radar systems, having a controllable frequency oscillator, whose output signal is partially coupled out into a feedback branch and compared with reference frequencies in a phase comparator, for whose generation at least one quartz oscillator is provided.

BACKGROUND OF THE INVENTION

In connection with high-resolution radar systems, it is often not possible to employ PLLs with a frequency divider in the feedback branch. The divider noise occurring in such PLLs too greatly impairs the frequency stability of the output signal.

In another known embodiment variant of a PLL which offers an improvement in regard to phase noise at the PLL output, the phase comparison is performed on a defined harmonic of the reference signal. The increased technical outlay for this variant makes possible the transfer of the quartz oscillator stability, which can be realized, to the output signal of the PLL even for the frequency multiplications. In this variant the selection of a defined upper harmonic wave, in particular in connection with large multiples of the reference frequency, takes place indirectly by the PLL. The latter can be considered to be a bandpass filter with a bandwidth corresponding to the bandwidth of the control loop. The selection of a defined frequency is performed by a pre-tuning process which takes place, for example, by a conventional digital control loop with a frequency divider described at the outset. When using a YIG oscillator with a digital driver, the preselection can take place by means of the driver. The actual control of the PLL takes place via the fine tuning of the YIG oscillator.

The reference frequency of such a sampling PLL is determined by the required step size. Therefore very large multiplication factors at the reference oscillator are required for generating high output frequencies. Besides the problem of achieving a sufficiently high output yield at high multiples of the reference frequency, which is necessary for maintaining a sufficient distance from the thermal noise, each doubling of the reference frequency raises the phase noise by 6 dB. Therefore, even with this concept the frequency stability is impaired, if high output frequencies are demanded with small step sizes in high-resolution radar systems.

It therefore is the object of the invention to provide a low-noise sampling PLL for high-resolution radar systems.

SUMMARY OF THE INVENTION

The above object generally is achieved according to the present invention by a sampling PLL for high-resolution radar systems, which has a controllable frequency oscillator, whose output signal is partially coupled out into a feedback branch and compared with reference frequencies in a phase comparator, with the reference frequencies being taken from a line spectrum (SPK), which has been generated from the mixture of a low quartz oscillator frequency (F1) with a high quartz oscillator frequency (F2), and with the quartz oscillator frequencies (F1, F2) being synchronized.

Further embodiments and modification of the invention are disclosed.

The invention makes advantageous use of a property of quartz oscillators which is, that it is possible to realize quartz oscillators with approximately the same phase noise performance in a frequency range between 5 MHZ to 100 MHZ. Based on this property, in accordance with the invention, the reference signal for the sampling PLL is generated in the form of a line spectrum by means of frequency mixing. It is possible in this way to generate high output frequencies with small multiplication factors. When using the attainment of the object in accordance with the invention, a clear improvement in stability of the output signal occurs because of the given square dependency of the phase noise on the multiplication factors.

Exemplary embodiments of the invention will be explained in greater detail by means of the drawings.

DETAILED DESCRIPTION OF THE PREFERRED EMBODIMENTS

Figure 1:
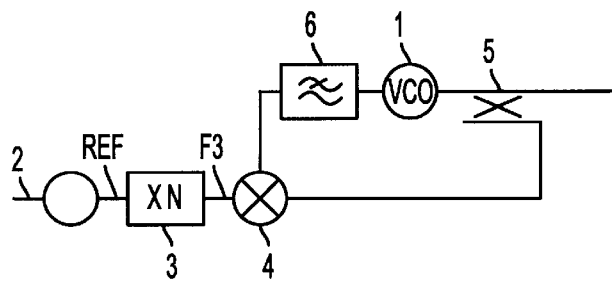
FIG. 1 is a schematic block circuit diagram representing a sampling PLL with reference frequency generation in accordance with the prior art.

The sampling PLL represented in FIG. 1 consists of a controllable oscillator 1, a quartz oscillator 2, a multiplier 3, a mixer 4, an outcoupler 5 and a low pass filter 6.

In this sampling PLL, the phase comparison takes place in a known manner on a predetermined upper harmonic F3 of the reference signal REF. To this end, the reference signal REF passes through the multiplier 3 prior to being fed to the mixer 4 for the phase comparison with an outcoupled portion of the output signal of the oscillator 1, and thus of the PLL. Following filtering in the low pass filter 6, the output signal of the mixer 4 is used as a corrective signal for the controllable oscillator 1. This oscillator 1 is a voltage-controlled oscillator VCO. But a YIG oscillator, for example, could also be used for the oscillator 1.

To improve the phase noise at the output of a sampling PLL embodied in this way, in accordance with the invention the reference generation is altered in such a way that large multiplications are avoided here. Two variants or embodiments are provided for attaining the object on which this is based. With both embodiments, the desired respective reference frequencies used for the comparison are taken from a line spectrum generated from a mixture of two quartz oscillator frequencies. The embodiment according to FIG. 2 requires little hardware outlay, along with possibly potential limitations regarding the completeness and uniformity of the generated line spectrum. The embodiment according to FIG. 3 is a more elaborate method and apparatus and provides a complete and uniform line spectrum.

Figure 2:
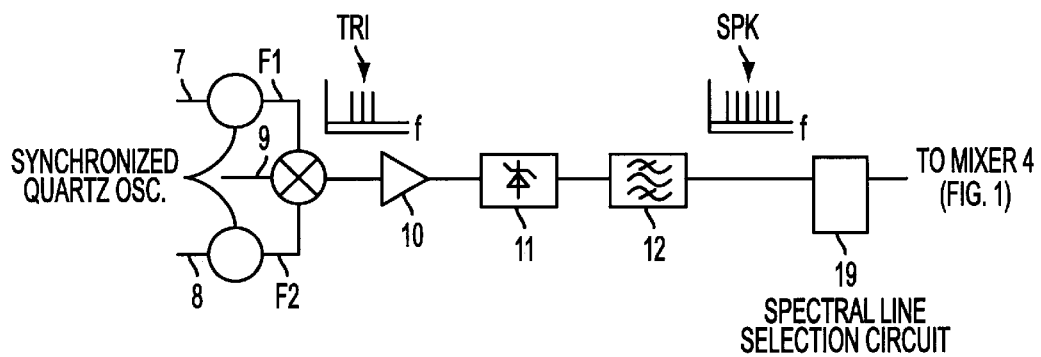
FIG. 2 is a schematic block circuit diagram of a circuit for generating a reference frequency for the PLL of FIG. 1 by multiplication of a line triplet according to a first embodiment of the invention.
Figure 3:
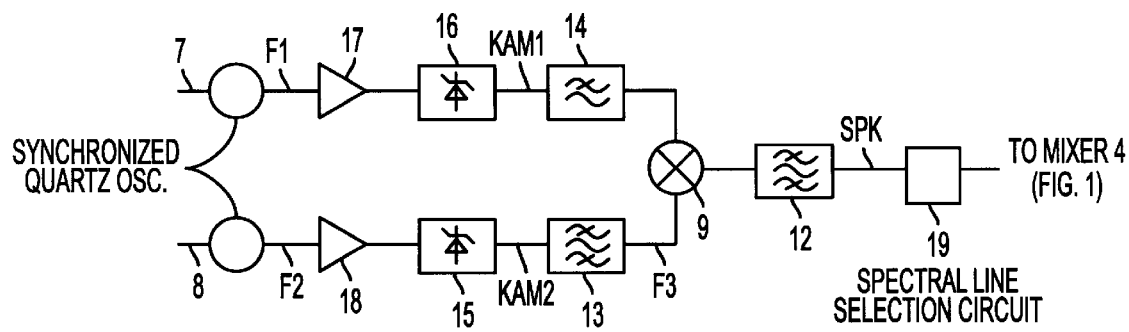
FIG. 3 is a schematic block circuit diagram of a circuit for generating a reference frequency for the PLL of FIG. 1 which is created by the mixing of a comb spectrum with a higher single frequency according to a further embodiment of the invention.

The reference frequency generation circuit represented in FIG. 2 replaces the reference signal generation portion of the sampling PLL represented in FIG. 1, i.e., the oscillator 2 and the multiplier 3. The reference frequency signal generation circuit in accordance with the invention consists of a quartz oscillator 7, a quartz oscillator 8, a mixer 9, an amplifier 10, a step recovery diode multiplier 11 and a bandpass filter 12.

The quartz oscillator 7 generates a low quartz oscillator frequency F1 of a value of, for example, 5 MHZ, and the quartz oscillator 8 generates a high oscillator frequency F2 of a value of, for example, 100 MHZ. It is also possible to employ frequencies F1 and F2 with values differing from these for this purpose, if a sufficient short time stability (phase noise performance) can be realized. The frequencies F1 and F2 are supplied to the mixer 9, which, in a known manner, generates a line triplet TRI therefrom.

To maintain the coherence between the individual lines, it is necessary for the two quartz oscillators 7 and 8 to be synchronized as indicated. Circuit arrangements for synchronizing the two frequencies F1 and F2 are known to those skilled in the art and have not specifically been represented in FIG. 2 for reasons of showing a clear representation of the embodiment in accordance with the invention; for example, both quartz oscillators 7 and 8 can be included in a separate PLL. In this connection, the narrowest loop bandwidth should be attempted, so that uncorrelated side bands are present even with low offset frequencies. It would otherwise be possible that in place of output additions, voltage additions could occur in the mixer 9, which in turn could result in a loss of maximally 3 dB of the phase noise.

The line triplet TRI is sufficiently amplified in the amplifier 10 and supplied to the step recovery diode multiplier 11, which generates, in a known manner, a line spectrum SPK of its output. It might be necessary to limit the edges of the line spectrum by a downstream-connected bandpass filter 12. The mostly continuous distribution of the line spectrum SPK generated in this manner can be explained by the generation of higher order inter-modulation products. This can be proven by a sort of "FM marking" of a source. The effective degrees of multiplication result from this in turn, which for their part determine the phase noise properties. The line spectrum SPK is then fed to a line selection circuit 19, which in a known manner, selects the desired frequency line as a reference frequency and supplies same to the mixer 4.

The upper and the lower side bands of the line triplet TRI generated in this manner have different phase positions. In connection with some combinations of the quartz oscillator frequencies F1 and F2, this can result in individual lines in the spectrum being nearly eradicated, because of which the completeness and uniformity of the line spectrum SPK can be impaired.

The reference frequency generation circuit in accordance with FIG. 3 again consists of the two quartz oscillators 7 and 8, the mixer 9 and the bandpass filter 12 at the output. Different from the previously described embodiment in accordance with FIG. 2, the synchronized quartz oscillator frequencies F1 and F2 are not directly supplied to the mixer 9 for generating a line triplet TRI.

Rather, with this embodiment, a comb spectrum KAM1 is generated from the low quartz oscillator frequency F1, which spectrum KAM1 is supplied to the mixer 9 together with an upper harmonic F3 of the high oscillator frequency F2 in order to generate the line spectrum SPK. To generate the comb spectrum KAM1, following an amplification of the low quartz oscillation frequency F1, the comb spectrum KAM1 is generated from the latter by means of a step recovery diode multiplier 16 and a downstream-connected low pass filter 14. The upper limit of the comb spectrum KAM1 should extend at least to F2/2. The upper harmonic F3 to be fed to the mixer 9 is filtered out of a comb spectrum KAM2, which has been generated by a step recovery diode multiplier 15 from the high quartz oscillator frequency F2 after being amplified by an amplifier 18, by a bandpass filter 13.

With a low oscillator frequency F1 of, for example, 5 MHZ, a high oscillator frequency F2 of, for example, 100 MHZ, an upper limit of the comb spectrum KAM1 at, for example, 50 MHZ, and a multiplication of the high oscillator frequency F2 by a factor of, for example, 10, it is possible in accordance with the embodiment of FIG. 3 to generate a line spectrum between 950 MHZ to 1050 MHZ with a step width of 5 MHZ. At the effective multiplication of 10, the phase noise would be increased by maximally 20 dB. If with the prior art in accordance with FIG. 1 it were intended to generate a line spectrum with a step width of 5 MHZ at 1 GHz, it would be necessary to multiply the 5 MHZ reference by a factor of 200, and therefore the phase noise would be increased by 46 dB. With the embodiment according to FIG. 3 of the invention, the phase noise performance is thereby improved by at least 20 dB.

If a line spectrum which is wider than F2 is required, the bandpass filter 13 must be switchable, so that adjoining upper harmonics F3 can be supplied to the mixer 9.

The specific manner of selecting the individual frequency lines from the line spectrum SPK for performing the phase comparison in the mixer 4 of the sampling PLL has not been specifically addressed in the specification and the drawings, but is shown only schematically of 19 since any arbitrary means for this are available to one skilled in the art.

The invention now being fully described, it will be apparent to one of ordinary skill in the art that many changes and modifications can be made thereto without departing from the spirit or scope of the invention as set forth herein.

What is claimed is:

1. A sampling phase locked loop (PLL) for high-resolution radar systems, comprising: a controllable frequency oscillator having an output; a coupler connected to the output of the controllable oscillator and coupling out a portion of the output signal of the oscillator and supplying the coupled out signal to a feedback branch as a feedback signal; circuit means for producing a reference frequency; and a phase comparator having one input connected to the feedback branch and a second input connected to receive the reference frequency for comparing the feedback signal with the reference signal to produce an error signal at an output which is connected to a control input of the controllable oscillator; and wherein the circuit means for producing a reference frequency signal includes first and second synchronized quartz oscillators producing a first high frequency output signal and a second low frequency output signal, respectively, and circuit means for mixing the high and low oscillator output signals to produce a line spectrum and for selecting a reference frequency from the line spectrum.

2. The sampling PLL according to claim 1, wherein the circuit means for mixing includes a mixer connected to receive the first high frequency output signal and the second low frequency output signal and mixing same to generate a line triplet (TRI) in its output signal, an amplifier connected to an output of the mixer for amplifying the mixer output signal, and a step recovery diode multiplier connected to an output of the amplifier and at whose output the line spectrum (SPK) is generated.

3. The sampling PLL according to claim 2, further comprising a bandpass filter connected to an output of the step recovery diode for filtering the line spectrum (SPK) prior to selection and removal of the reference frequency.

4. The sampling PLL according to claim 1, wherein the circuit means for mixing includes: a multiplier connected to receive the low frequency signal and to multiply the low oscillator frequency (F1) into a comb spectrum (KAM1); a circuit connected to the output of the first high frequency oscillator and providing at least one upper harmonic (F3) of the high oscillator frequency (F2), and a mixer which mixes the comb spectrum with the at least one upper harmonic to generate the line spectrum (SPK).

5. The sampling PLL according to claim 4, wherein: the multiplier which generates the comb spectrum (KAM1) from the low oscillator frequency (F1) is a first step recovery diode multiplier; a low pass filter is connected between the first step recovery diode and the mixer; and the circuit which provides the at least one harmonic includes a second step recovery diode which generates second comb spectrum (KAM2) from the high frequency signal from the first quartz oscillator, and a bandpass filter which filters the upper harmonics out of the second comb spectrum (KAM2) and provides same to the mixer.

6. The sampling PLL according to claim 4, wherein the comb spectrum (KAM1) is sequentially mixed with several adjoining harmonics (F3) to widen the line spectrum (SPK).

7. The sampling PLL according to claim 6, wherein the multiplier which generates the comb spectrum (KAM1) from the low oscillator frequency (F1) is a first step recovery diode multiplier; a low pass filter is connected between the first step recovery diode and the mixer; and the circuit which provides the at least one harmonic includes a second step recovery diode which generates a second comb spectrum (KAM2) from the high frequency signal from the first quartz oscillator, and a switchable bandpass filter which filters the upper harmonics out of the second comb spectrum (KAM2) and provides same to the mixer.

8. The sampling PLL according to claim 4, wherein the upper frequency of the comb spectrum (KAM1) extends at least to half frequency of the high oscillator frequency (F2).

9. The sampling PLL according to claim 8, wherein: the multiplier which generates the comb spectrum (KAM1) from the low oscillator frequency (F1) is a first step recovery diode multiplier; a low pass filter is connected between the first step recovery diode and the mixer; and the circuit which provides the at least one harmonic includes a second step recovery diode generates a second comb spectrum (KAM2) from the high frequency signal from the first quartz oscillator, and a bandpass filter which filters the upper harmonics out of the second comb spectrum (KAM2) and provides same to the mixer.

10. The sampling PLL according to claim 8, wherein the comb spectrum (KAM1) is sequentially mixed with several adjoining harmonics (F3)to widen the line spectrum (SPK),.

11. The sampling PLL according to claim 10, wherein the multiplier which generates the comb spectrum (KAM1) from the low oscillator frequency (F1) is a first step recovery diode multiplier; a low pass filter is connected between the first step recovery diode and the mixer; and the circuit which provides the at least one harmonic includes a second step recovery diode which generates a second comb spectrum (KAM2) from the high frequency signal from the first quartz oscillator, and a switchable bandpass filter which filters the upper harmonics out of the second comb spectrum (KAM2) and provides same to the mixer.

12. The sampling PLL according to claim 1, wherein the low quartz oscillator frequency (F1) is 5 MHZ and the high quartz oscillator frequency (F2) is 100 MHZ.

13. A method of forming a reference frequency for phase comparison with a feedback signal of a sampling phase locked loop circuit for a high-resolution radar system to produce an error signal for a controllable oscillator of the phase locked loop circuit, said method comprising: providing first and second synchronized quartz oscillators which produce a high output frequency and a low output frequency, respectively; mixing the high and low output frequencies; generating a line spectrum from the mixed frequency signals; and deriving a desired reference frequency from the line spectrum.

14. The method according to claim 13, wherein a line triplet (TRI) is generated during the step of mixing of the quartz oscillator frequencies (F1, F2); and further comprising: amplifying the line triplet and thereafter suppling the amplified line triplet to a step recovery diode multiplier at whose output the line spectrum (SPK) is generated.

15. The method according to claim 14, further comprising passing the line spectrum (SPK) through a bandpass filter before removal of the reference frequencies.

* * * * *